United States Patent
Chen et al.

(10) Patent No.: US 10,756,230 B2
(45) Date of Patent: Aug. 25, 2020

(54) METHODS FOR FORMING AN INTERDIGITATED BACK CONTACT HETEROJUNCTION PHOTOVOLTAIC DEVICE WITH A FLOATING JUNCTION FRONT SURFACE FIELD

(71) Applicant: INTERNATIONAL BUSINESS MACHINES CORPORATION, Armonk, NY (US)

(72) Inventors: Tze-Chiang Chen, Yorktown Heights, NY (US); Bahman Hekmatshoartabari, White Plains, NY (US); Devendra K. Sadana, Pleasantville, NY (US); Davood Shahrjerdi, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 72 days.

(21) Appl. No.: 15/927,243

(22) Filed: Mar. 21, 2018

(65) Prior Publication Data

US 2018/0212094 A1    Jul. 26, 2018

Related U.S. Application Data

(60) Division of application No. 13/966,781, filed on Aug. 14, 2013, now Pat. No. 9,985,167, which is a
(Continued)

(51) Int. Cl.
*C30B 25/18* (2006.01)
*H01L 31/20* (2006.01)
(Continued)

(52) U.S. Cl.
CPC ...... *H01L 31/202* (2013.01); *H01L 31/02167* (2013.01); *H01L 31/022441* (2013.01); *H01L 31/0747* (2013.01); *Y02E 10/50* (2013.01)

(58) Field of Classification Search
CPC ......... C30B 25/00; C30B 25/02; C30B 25/04; C30B 25/18; C30B 25/20;
(Continued)

(56) References Cited

U.S. PATENT DOCUMENTS 4,547,622 A    10/1985  Fan et al.
5,580,381 A    12/1996  Yamagata
(Continued)

FOREIGN PATENT DOCUMENTS

KR        10115195 B1      2/2012
WO        WO2009094578 A2  7/2009
(Continued)

OTHER PUBLICATIONS

List of IBM Patents or Patent Applications Treated as Related dated Mar. 21, 2018, 2 pages.
(Continued)

*Primary Examiner* — Kenneth A Bratland, Jr.
(74) *Attorney, Agent, or Firm* — Tutunjian & Bitetto, P.C.; Erik Johnson

(57) ABSTRACT

A photovoltaic device includes a crystalline substrate having a first dopant conductivity, an interdigitated back contact and a front surface field structure. The front surface field structure includes a crystalline layer formed on the substrate and a noncrystalline layer formed on the crystalline layer. The crystalline layer and the noncrystalline layer are doped with dopants having an opposite dopant conductivity from that of the substrate. Methods are also disclosed.

10 Claims, 9 Drawing Sheets

Related U.S. Application Data continuation of application No. 13/763,171, filed on Feb. 8, 2013, now Pat. No. 9,859,455.

(51) Int. Cl.
*H01L 31/0216* (2014.01)
*H01L 31/0224* (2006.01)
*H01L 31/0747* (2012.01)

(58) Field of Classification Search
CPC ....... H01L 31/02167; H01L 31/022441; H01L 31/04; H01L 31/054; H01L 31/06; H01L 31/072; H01L 31/0745; H01L 31/0747; H01L 31/20; H01L 31/202; Y02E 10/50
USPC ................. 117/84, 88–89, 105, 928, 935
See application file for complete search history.

(56) References Cited

U.S. PATENT DOCUMENTS

| | | | |
|---|---|---|---|
| 5,944,913 A | | 8/1999 | Hou et al. |
| 6,262,359 B1* | | 7/2001 | Meier ............... H01L 31/02242 136/255 |
| 7,476,420 B2 | | 1/2009 | Skarp et al. |
| 7,553,691 B2 | | 6/2009 | Fatemi et al. |
| 7,816,236 B2 | | 10/2010 | Bauer et al. |
| 8,927,323 B2* | | 1/2015 | Chen ..................... H01L 31/077 438/87 |
| 8,969,711 B1 | | 3/2015 | Pethuraja et al. |
| 2005/0062041 A1 | | 3/2005 | Terakawa et al. |
| 2005/0205960 A1* | | 9/2005 | Nagashima ....... H01L 31/02167 257/486 |
| 2006/0130891 A1* | | 6/2006 | Carlson ............. H01L 31/02168 136/256 |
| 2006/0205194 A1* | | 9/2006 | Bauer ..................... C23C 16/04 438/542 |
| 2007/0235759 A1 | | 10/2007 | Henson et al. |
| 2008/0061293 A1 | | 3/2008 | Ribeyron et al. |
| 2008/0230116 A1 | | 9/2008 | Kannou et al. |
| 2009/0014063 A1 | | 1/2009 | Stangl et al. |
| 2009/0056800 A1* | | 3/2009 | Ulyashin ........... H01L 31/02167 136/256 |
| 2009/0215218 A1* | | 8/2009 | Meier ................. H01L 31/0745 438/80 |
| 2009/0215219 A1 | | 8/2009 | Ajiki et al. |
| 2009/0317934 A1* | | 12/2009 | Scherff ............. H01L 31/02242 438/72 |
| 2010/0186802 A1 | | 7/2010 | Borden |
| 2010/0236613 A1 | | 9/2010 | Lee et al. |
| 2011/0139231 A1 | | 6/2011 | Meier et al. |
| 2011/0303280 A1 | | 12/2011 | Pawlak et al. |
| 2012/0042945 A1 | | 2/2012 | Ji et al. |
| 2012/0083104 A1 | | 4/2012 | Abbott et al. |
| 2012/0132250 A1 | | 5/2012 | Cornfeld |
| 2012/0167973 A1 | | 7/2012 | Hu et al. |
| 2012/0171806 A1 | | 7/2012 | Meier et al. |
| 2012/0210932 A1 | | 8/2012 | Hekmatshoar-Tabari et al. |
| 2012/0211068 A1 | | 8/2012 | Cornfeld et al. |
| 2012/0279562 A1 | | 11/2012 | Yang et al. |
| 2012/0312361 A1 | | 12/2012 | Hekmatshoar-Tabari et al. |
| 2012/0312362 A1 | | 12/2012 | Hekmatshoar-Tabari et al. |
| 2012/0318336 A1 | | 12/2012 | Hekmatshoar-Tabari et al. |
| 2013/0247970 A1 | | 9/2013 | Morigami et al. |

FOREIGN PATENT DOCUMENTS

| | | |
|---|---|---|
| WO | 2011078521 A2 | 6/2011 |
| WO | WO2011073868 A2 | 6/2011 |
| WO | 2011105554 A1 | 9/2011 |
| WO | WO2012036760 A1 | 3/2012 |
| WO | WO2012091252 A1 | 7/2012 |

OTHER PUBLICATIONS

International Business Machines Corporation "Notification of Transmittal of the International Search Report and the Written Opinion of the International Searching Authority, or the Declaration," mailed for PCT/US2014/014619 dated May 22, 2014. (10 Pages).

International Business Machines Corporation "Notification of Transmittal of the International Search Report and the Written Opinion of the International Searching Authority, or the Declaration," mailed for PCT/US2014/014621 dated May 22, 2014. (10 Pages).

R. Ferre et al,, "Surface and emitter passivation of crystalline silicon by amorphous silicon carbide: Evolution with annealing", 21st European Photovoltaic Solar Energy conference, Sep. 4-8, 2006, Dresden, Germnay.

Office Action issued in U.S. Appl. No. 14/946,495 dated Jun. 12, 2017, pp. 1-11.

Office Action issued in U.S. Appl. No. 13/763,219 dated Jun. 8, 2016, pp. 1-10.

U.S. Notice of Allowance issued in U.S. Appl. No. 14/946,495 dated Apr. 4, 2018, 8 pages.

U.S. Office Action issued in U.S. Appl. No. 14/946,495 dated Oct. 2, 2017, 13 pages.

U.S. Office Action issued in U.S. Appl. No. 13/967,126 dated Sep. 2, 2014, 8 pages.

* cited by examiner

METHODS FOR FORMING AN INTERDIGITATED BACK CONTACT HETEROJUNCTION PHOTOVOLTAIC DEVICE WITH A FLOATING JUNCTION FRONT SURFACE FIELD

RELATED APPLICATION DATA

This application is a Continuation application of co-pending U.S. patent application Ser. No. 13/763,171 filed on Feb. 8, 2013, incorporated herein by reference in its entirety. This application is related to commonly assigned application Ser. No. 13/763,219 filed on Feb. 8, 2013, and incorporated herein by reference.

BACKGROUND

Technical Field

The present invention relates to photovoltaic devices and fabrication methods, and more particularly to a front surface field junction for interdigitated back contact devices forming a floating junction.

Description of the Related Art

Inter-digitated back-contact (IBC) solar cell structures are of interest for increasing short circuit current ($J_{sc}$) (and therefore efficiency) of the solar cells by forming both an emitter junction, a back surface field (BSF) junction and the associated metallization on a backside of the solar cell. This permits sunlight to enter from a front side with minimum shadowing loss. In the case of heterojunction (HJ) solar cells, hydrogenated amorphous silicon (a-Si:H) containing material may be employed to form a front surface field (FSF) in addition to forming the emitter and/or BSF junctions. Such a FSF junction is typically formed by using an intrinsic (i) a-Si:H layer to passivate the front surface of a crystalline silicon (c-Si) substrate, followed by a doped a-Si:H layer having the same conductivity type as that of the c-Si substrate. In this way, the intrinsic layer is sandwiched between the c-Si substrate and the doped a-Si layer, and the c-Si substrate and the doped a-Si layer have a same dopant conductivity type.

The doped a-Si layer provides an electric field to repel minority carriers generated in the c-Si substrate from the front surface of the c-Si substrate thus reducing carrier recombination at the front surface of the c-Si substrate. In some instances, the doped a-Si:H containing material may be omitted. In such cases, the presence of the intrinsic and/or doped a-Si:H containing material at the front surface results in some absorption loss reducing the short circuit current of the solar cell accordingly. This is because a-Si:H and related alloys are direct bandgap materials, and, therefore, light absorption in these materials is strong. Due to the presence of a large density of defects in these materials, diffusion length of minority carriers in these materials is small and therefore a significant portion of the photogenerated carriers in these materials is lost by recombination prior to reaching the c-Si substrate.

SUMMARY

A photovoltaic device includes a crystalline substrate having a first dopant conductivity, an interdigitated back contact and a front surface field structure. The front surface field structure includes a crystalline layer formed on the substrate and an amorphous layer formed on the crystalline layer. The crystalline layer and the noncrystalline layer are doped with dopants having an opposite dopant conductivity as the substrate.

Another photovoltaic device includes a Si-containing crystalline substrate having a first dopant conductivity and an interdigitated back contact having back surface field stacks and emitter stacks. A front surface field structure includes a hydrogenated Si-containing crystalline layer formed on the substrate and a hydrogenated Si-containing noncrystalline layer formed on the crystalline layer. The crystalline layer and the noncrystalline layer are doped with dopants having an opposite dopant conductivity than that of the substrate. A floating p-n junction is formed at an interface between the crystalline layer and the substrate, the p-n junction being configured to repel majority carriers from a front surface.

A method for forming a photovoltaic device includes forming an interdigitated back contact on a crystalline substrate having a first dopant conductivity; and forming a front surface field structure on the substrate by: forming a crystalline layer on the substrate; and forming a noncrystalline layer on the crystalline layer, the crystalline layer and the noncrystalline layer being doped with dopants having an opposite dopant conductivity than the substrate.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
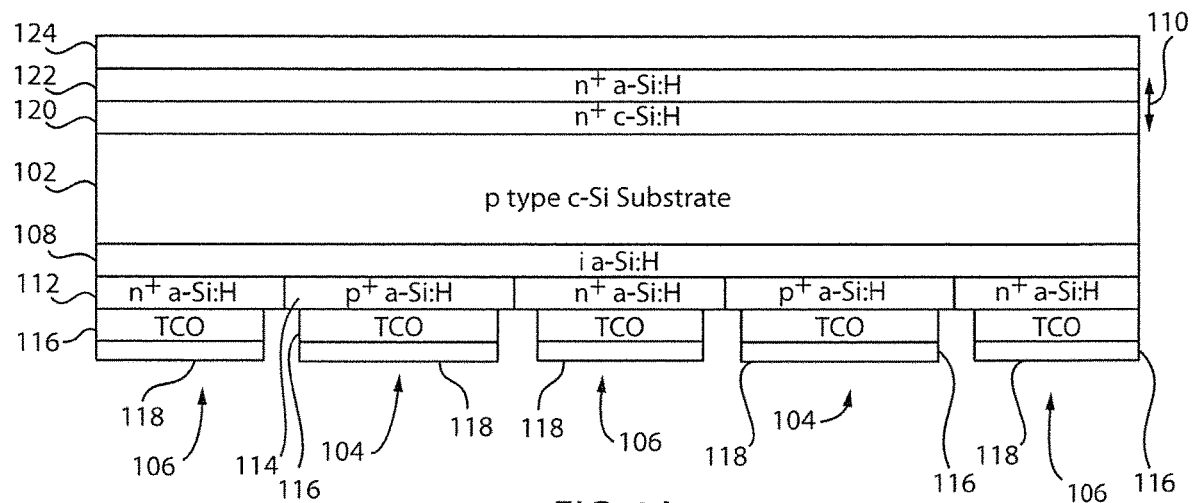
FIG. 1A is a cross-sectional view of a photovoltaic device having a front surface field contact with an n-doped crystalline layer and an n-doped noncrystalline layer, and an interdigitated back contact in accordance with one embodiment.

In accordance with the present principles, inter-digitated back-contact photovoltaic devices and methods for fabrication are provided. The photovoltaic devices include a front surface field (FSF) junction having a crystalline layer and a noncrystalline layer formed on a crystalline substrate. The crystalline layer, noncrystalline layer have a different dopant conductivity from the substrate. In one embodiment, the crystalline layer includes hydrogenated crystalline Si (c-Si: H) having the opposite conductivity type as that of the substrate. The substrate may include c-Si, and the noncrystalline layer which includes a hydrogenated non-crystalline material which is either intrinsic or has the same conductivity type as that of the crystalline layer (doped c-Si:H) and opposite that of the substrate (c-Si).

In one embodiment, the crystalline layer forms a p-n junction (floating junction) with the substrate, which is configured to repel majority carriers from the FSF. The floating junction refers to a p-n junction which is not biased externally. The crystalline layer has a higher doping than that of the substrate. The crystalline layer may be hydrogenated Si (c-Si:H) and include between about 5-40 atomic % hydrogen.

It is to be understood that the present invention will be described in terms of a given illustrative architecture having illustrative substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiC or SiGe. These compounds include different proportions of the elements within the compound, e.g., SiC includes $Si_xC_{1-x}$ where x is less than or equal to 1, or SiGe includes $Si_xGe_{1-x}$ where x is less than or equal to 1, etc. In addition, other elements may be included in the compound, such as, e.g., dopants, hydrogen, etc. and still function in accordance with the present principles. The compounds with additional elements may be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It should be noted that the materials, material structures, dopant types and dopant quantities indicated in the FIGs. are for ease of reference/understanding, and are for illustrative purposes only. Referring now to the drawings in which like numerals represent the same or similar elements and initially to FIG. 1A, a cross-section of an interdigitated back contact (IBC) heterojunction (HJ) photovoltaic cell 100 is shown in accordance with one illustrative embodiment. Cell 100 includes a p-type crystalline substrate 102. In a particularly useful embodiment, the substrate includes crystalline Si (c-Si). The cell 100 includes emitter contacts or junctions 106 and back surface field (BSF) contacts or junctions 104. The junctions 104 and 106 are formed by stacks of an intrinsic layer 108 (e.g., hydrogenated amorphous Si) and doped layers 112 and 114, which are respectively n+ doped and p+ doped. The doped layers may include n+ a-Si:H (112), and p+ a-Si:H (114), respectively. An electrode 116 may include a transparent conductive oxide (TCO) material (e.g., indium-tin-oxide, aluminum doped zinc-oxide, or other materials). The TCO material of electrode 116 may serve to improve reflection from a back surface 118, and/or serve as a barrier against a reaction of the electrode 116 with a-Si:H of layer 112 and 114 (e.g., by inter-diffusion).

A thickness of the intrinsic a-Si:H layer 108 may be in the range of about 3-25 nm, although thinner or thicker layers may be used. The thickness of the doped a-Si:H layers 112 and 114 may be in the range of about 5-30 nm although thinner or thicker layers may be employed. Although the p+ and n+ a-Si:H regions 112 and 114 are illustrated as adjacent to each other in the FIGS., it will appreciated by those skilled in the art that there may be a separation or overlap between the edges of these regions. It will also be appreciated that the thickness of the i a-Si:H layer 108 may be different underneath the p+ a-Si:H regions 114 as compared to underneath the n+ a-Si:H regions 112, and/or compared to any overlapping region and/or separation between p+ and n+ a-Si:H regions 114 and 112. It will be further appreciated that the p+ a-Si:H layers 114 may have a different thickness than the n+ a-Si:H layers 112.

A front surface field (FSF) junction 110 is formed on a side of the substrate 102 opposite the emitter junctions 106 and BSF junctions 104. The FSF junction 110 includes thin continuous layers. Note that light (e.g., sunlight) enters the cell 100 from the front side, and since all the metallization is formed on the back side of the cell 100, there is no shadowing due to the presence of a metal grid. Note also that thinner layers are employed for layers of the FSF junction 110 as compared to the back side of the cell 100 to reduce absorption loss.

The FSF junction 110 includes an n+ doped crystalline layer 120 formed on the p-type substrate 102. The crystalline layer 120 may include a hydrogenated c-Si (c-Si:H) layer. The layer 120 replaces an intrinsic layer a-Si:H used to passivate the front surface of the c-Si substrate in a conventional structure. Since the layer 120 is crystalline, absorption loss in the FSF stack is reduced by omitting intrinsic a-Si:H from the FSF stack. A noncrystalline layer 122 is formed on the crystalline layer 120. The noncrystalline layer 122 may include a hydrogenated amorphous Si (a-Si:H) layer. The layer 122 includes a same dopant conductivity as layer 120. In this embodiment, both layers 120 and 122 have an opposite dopant conductivity than that of the substrate 102.

The layer 120 and 122 (e.g., n+c-Si:H/n+a-Si:H) form a floating p-n junction at the front surface for repelling majority carriers (holes) and reducing carrier recombination at the front surface.

The crystalline layer 120 may be single-crystalline or poly-crystalline. When the substrate 102 is single-crystalline (mono-crystalline), the crystalline layer is also preferably single-crystalline, and when the substrate 102 is multi-crystalline, the crystalline layer 102 is preferably poly-crystalline. The selection of the morphology is due to the preference of growing the crystalline layer 120 on the substrate 102 using a high quality, low temperature epitaxial growth process. One such process is described in U.S. patent application Ser. No. 13/032,866, filed on Feb. 23, 2011, entitled "Low-Temperature Selective Epitaxial Growth of Silicon for Device Integration", which is incorporated herein by reference.

In one example where the active doping level of the substrate 102 is in the range of $10^{14}$-$5\times10^{18}$ cm$^{-3}$, the active doping level of the crystalline layer 120 is in the range of $10^{16}$-$3\times10^{20}$ cm$^{-3}$. In another example where the active doping level of the substrate 102 is in the range of $10^{16}$-$5\times10^{17}$ cm$^{-3}$, the active doping level of the crystalline layer 120 is in the range of $10^{18}$-$10^{20}$ cm$^{-3}$. A thickness of the doped crystalline layer 120 may be less than a diffusion length of minority carriers in the doped crystalline layer 120. In one example, an n+ c-Si:H layer 120 has an active doping concentration in the range of $10^{19}$-$10^{20}$ cm$^{-3}$, the minority hole diffusion length in the n+c-Si:H of layer 120 is in the range of 50 nm-2 μm, and the thickness of the n+ c-Si:H layer 120 is in the range of 1 nm-100 nm. In another example, the n+ c-Si:H layer 120 has an active doping concentration in the range of $10^{19}$-$10^{20}$ cm$^{-3}$, the minority hole diffusion length in the n+ c-Si:H layer 120 is in the range of 50 nm-2 μm, and the thickness of the n+ c-Si:H layer is in the range of 1 nm-25 nm. In yet another example, the n+ c-Si:H layer 120 has an active doping concentration of $5 \times 10^{19}$ cm$^{-3}$, the minority hole diffusion length in the n+ c-Si:H layer 120 is in the range of 100 nm-1 μm, and the thickness of the n+ c-Si:H layer is in the range of 2 nm-15 nm.

Formation of the layer 120 may include employing a low temperature plasma enhanced chemical vapor deposition (PECVD) process to epitaxially grow a crystalline structure on the substrate 102. The PECVD process may employ gas sources used for the growth of the c-Si:H layer 120, which may include but is not limited to SiH$_4$ (silane), Si$_2$H$_4$ (disilane), SiH$_2$Cl$_2$ (dichlorosilane), SiF$_4$ (tetrafluorosilane) precursor gas, and combinations thereof, and H$_2$ carrier/dilution gas. The dilution gas to precursor gas flow ratio may be, e.g. [H$_2$]/[SiH$_4$]>5. The dopant gases (preferably flowed in-situ) may include but are not limited to PH$_3$ (phosphine) for n-type doping, and B$_2$H$_6$ (diborane) or TMB (tri-methylboron) for p-type doping. The c-Si:H layer 120 may include germanium (Ge), nitrogen (N), oxygen (O), fluorine (F), deuterium (D), chlorine (Cl), carbon (C) or combinations thereof. The gas source employed for Ge containing layers may include germane (GeH$_4$). The gas source used for C containing layers (e.g., if c-SiC:H is employed) may include methane (CH$_4$), ethylene (C$_2$H$_4$), propylene (C$_3$H$_6$), but other sources (typically of the form C$_x$H$_y$) may be used as well.

A preferred technique for growing these materials is plasma-enhanced chemical vapor deposition (PECVD); however, other growth processes such as hot-wire CVD (HWCVD) may be employed. Growth temperatures may be close to 200° C., with highest quality films being grown at temperatures in the range of 150-250° C.; however, growth temperatures in the range of room-temperature to 450° C. may be employed. The c-Si:H layer 120 may include 5-40 atomic percent of hydrogen. The c-Si:H layer 120 may include a thickness of about 1-25 nm, although other thicknesses may be employed.

The surface of the doped c-Si:H layer 120 is passivated by noncrystalline layer 122, which may include hydrogenated non-crystalline Si, which is either undoped or is doped with the same conductivity type as that of the c-Si:H layer 120. The a-Si:H layer 122 may include 5-40 atomic percent of hydrogen. The a-Si:H layer 122 may include a thickness of about 1-25 nm, although other thicknesses may be employed.

The term "noncrystalline" indicates that the material is amorphous, nano-crystalline or micro-crystalline. The hydrogenated noncrystalline material is may include a-Si:H; however, other materials such as hydrogenated amorphous silicon carbide (a-SiC:H), hydrogenated amorphous silicon germanium (a-SiGe:H), or combinations thereof may be used as well. These layers may contain nitrogen (N), oxygen (O), fluorine (F), deuterium (D), chlorine (Cl) or combinations thereof These materials may also be grown by plasma-enhanced chemical vapor deposition (PECVD), however, other growth techniques known in the art, such as hot-wire CVD (HWCVD) or sputtering may be used as well. In the case of PECVD or HWCVD, the gas source used for growing Si containing layers is silane (SiH$_4$) although other gases such as disilane (Si$_2$H$_6$), dichlorosilane (DCS), tetrafluorosilane (SiF$_4$) or combinations thereof may be used as well. These gas sources are (but not necessarily) mixed with hydrogen during growth. The gas source used for Ge containing layers is typically germane (GeH$_4$). The gas source used for C containing layers may include methane (CH$_4$), ethylene (C$_2$H$_4$), propylene (C$_3$H$_6$) but other sources (typically of the faun C$_x$H$_y$) may be used as well. In-situ p-type doping may be performed using diborane (B$_2$H$_6$) or trimethylboron (TMB) sources, and in-situ n-type doping may be performed using a phosphine (PH$_3$) gas source, although other dopant sources may be used as well. Ammonia (NH$_3$), nitrous oxide (N$_2$O) or other gas sources may be used for nitrogen containing layers. Carbon dioxide (CO$_2$), N$_2$O or O$_2$ may be used to provide oxygen for oxygen containing layers. A carrier gas such as hydrogen (H$_2$), deuterium (D$_2$) helium (He) or argon (Ar) may be used for any or all of the layers. The carrier gas may be premixed with the gas sources or flowed simultaneously with the gas source at the time of growth. Growth temperatures may be close to 200° C., with highest quality films being grown at temperatures in the range of 150-250° C.; however, growth temperatures in the range of room-temperature to 450° C. may be employed.

Additional layers may be formed on the noncrystalline layer 122. For example, an anti-reflection coating (ARC) layer 124 may be formed on the layer 122 from known ARC materials. The ARC layer 124 may be comprised of a wide-bandgap material including but not limited to hydrogenated amorphous silicon nitride (a-SiN$_x$:H), hydrogenated amorphous silicon oxide (a-SiO$_x$:H), hydrogenated amorphous silicon oxynitirde (a-SiN$_x$O$_y$:H), amorphous aluminum oxide, amorphous zinc-oxide, amorphous tin-oxide, or combinations (composition or multi-layer) thereof. The ARC layer 124 does not need to be conductive and is typically insulating, (the main requirement is optical transparency); however, a transparent conductive material such as TCO (including but not limited to indium-tin-oxide, Al-doped zinc-oxide, etc.) may be used to serve as the ARC layer 124 as well.

Figure 1B:
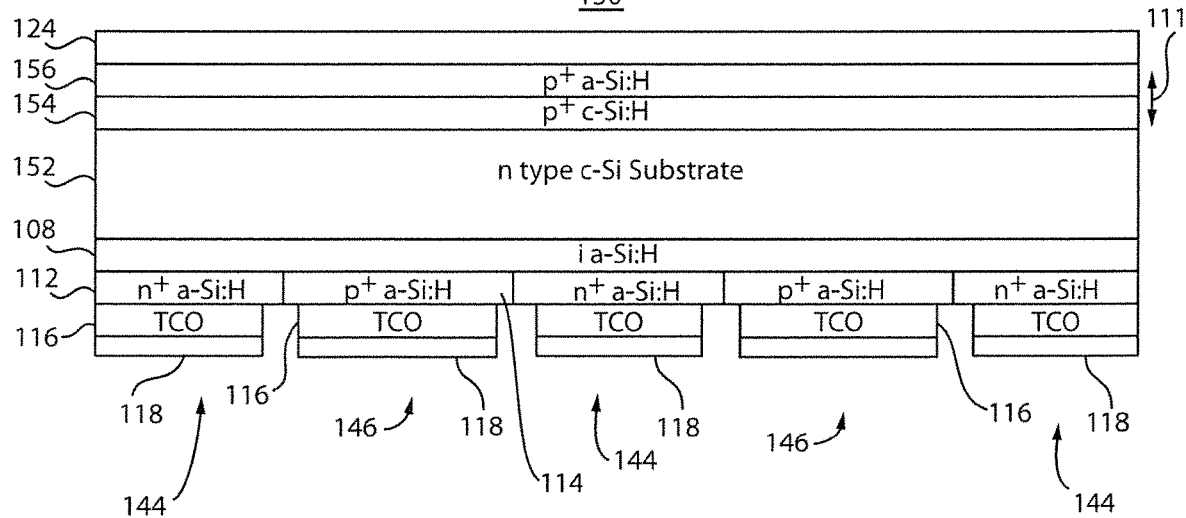
FIG. 1B is a cross-sectional view of a photovoltaic device having a front surface field contact with a p-doped crystalline layer and a p-doped noncrystalline layer, and an interdigitated back contact in accordance with one embodiment.

Referring to FIG. 1B, another exemplary IBC HJ photovoltaic cell 150 on an n-type crystalline substrate 152 is illustratively shown. This embodiment includes a FSF structure/junction 111 similar to the FSF structure 110 of FIG. 1A. Further, emitter contacts 146 and BSF contacts 144 are the similar to those in FIG. 1A, except that the emitter contacts 146 include the same structure as the BSF contacts 104 (FIG. 1A), and the BSF contacts 144 include the same structure as the emitter contacts 106 (FIG. 1A) due to the doping conductivity of the c-Si substrate 152, respectively. Cell 150 includes n-type doping for the substrate 152, and p-type doping for a crystalline layer 154 and a noncrystalline layer 156. As before, the intrinsic layer (a-Si:H) used to passivate the front surface of the c-Si substrate in a conventional structure is replaced with the crystalline layer 154. The crystalline layer 154 may include a p+ doped hydrogenated c-Si (c-Si:H) layer. Since the p+ c-Si:H is crystalline, absorption loss in the FSF 111 is reduced by omitting intrinsic a-Si:H. It should be understood that the structure, materials, doping, processing, etc. and their variations follow those described for FIG. 1A except the dopant conductivity of the substrate 152 is n-type in FIG. 1B.

Figure 2A:
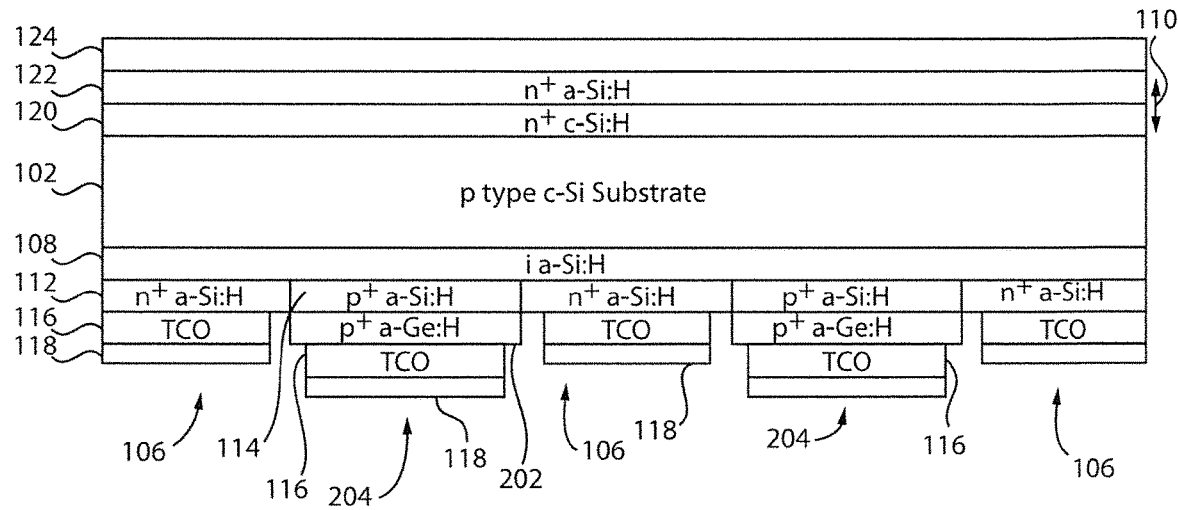
FIG. 2A is a cross-sectional view of the photovoltaic device of FIG. 1A having the interdigitated back contact including an interlayer between a p-doped layer and a transparent electrode in accordance with one embodiment.

Referring to FIG. 2A, another exemplary IBC HJ photovoltaic cell 200 is shown on a p-type c-Si substrate 102 according to another embodiment. In this embodiment, the structure of the cell 200 is the same as the structure of cell 100 of FIG. 1A, except that BSF contacts 204 include an interlayer 202 formed between the transparent electrode 116 and the amorphous doped layer 114. The interlayer 202 is p+ doped and includes a narrow bandgap material (e.g., p+ a-Ge:H) that is provided between p+ a-Si:H 114 and TCO 116 at the emitter contacts 204 to improve carrier transport. This may be due to the lower bandgap of a-Ge:H compared to a-Si:H, higher active doping of a-Ge:H compared to a-Si:H, or a combination thereof. In some embodiments, the higher active doping of a-Ge:H is due to modulation doping of a-Ge:H. It should be understood that other materials may be employed for the interlayer 202 or any other component.

Figure 2B:
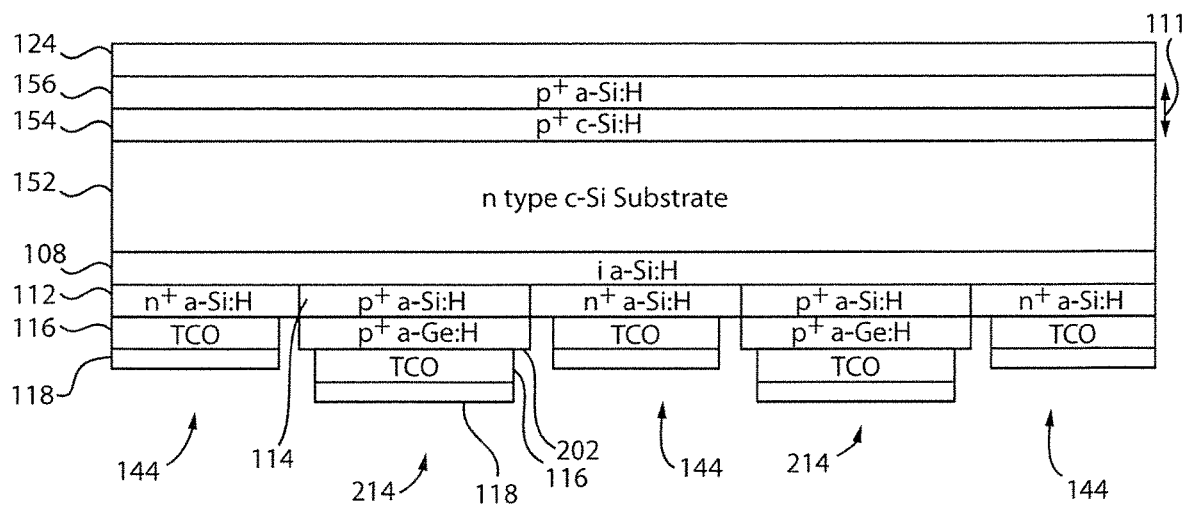
FIG. 2B is a cross-sectional view of the photovoltaic device of FIG. 1B having the interdigitated back surface field contact including an interlayer between a p-doped layer and a transparent electrode in accordance with one embodiment.

Referring to FIG. 2B, another exemplary IBC HJ photovoltaic cell 250 is shown on an n-type c-Si substrate 102 according to another embodiment. In this embodiment, the structure of the cell 250 is the same as the structure of cell 150 of FIG. 1B, except that emitter contacts 214 include an interlayer 202 formed between the transparent electrode 116 and the amorphous doped layer 114. The interlayer 202 is p+ doped and includes a narrow bandgap material (e.g., p+ a-Ge:H) that is provided between p+ a-Si:H 114 and TCO 116 at the BSF contacts 214 to improve carrier transport. This may be due to the lower bandgap of a-Ge:H compared to a-Si:H, higher active doping of a-Ge:H compared to a-Si:H, or a combination thereof. In some embodiments, the higher active doping of a-Ge:H is due to modulation doping of a-Ge:H. It should be understood that other materials may be employed for the interlayer 202 or any other component.

Figure 3A:
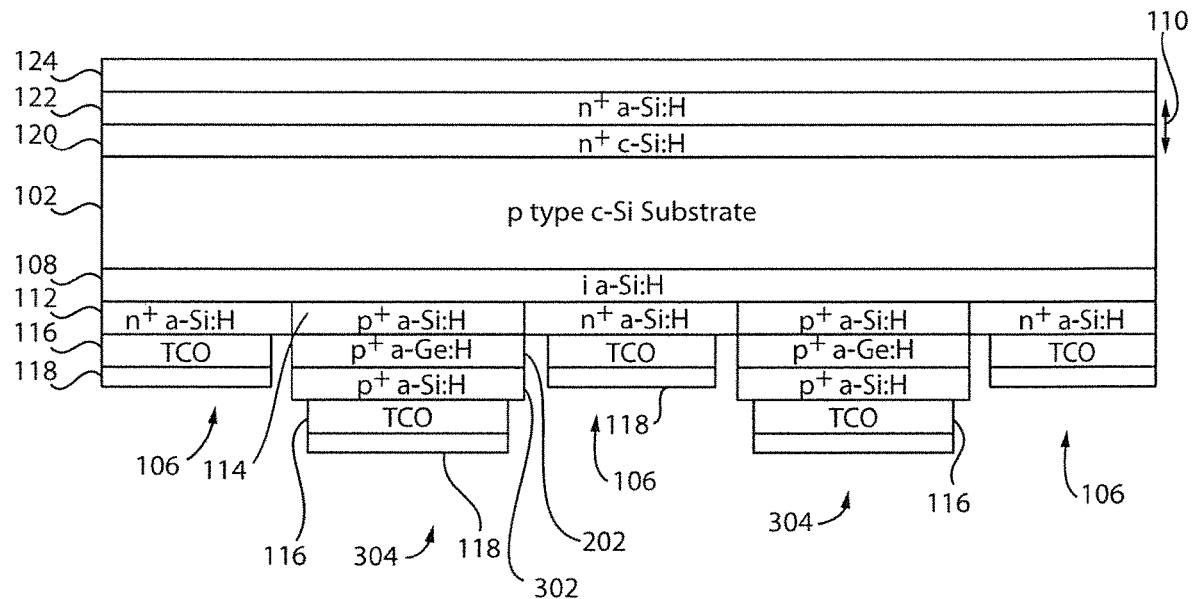
FIG. 3A is a cross-sectional view of the photovoltaic device of FIG. 2A having the interdigitated back contact including another p-doped layer formed on the interlayer in accordance with one embodiment.

Referring to FIG. 3A, another exemplary IBC HJ photovoltaic cell 300 is shown on a p-type c-Si substrate 102 according to another embodiment. In this embodiment, the structure of the cell 300 is the same as the structure of cell 200 of FIG. 2A, except that BSF contacts 304 include the interlayer 202 and another amorphous layer 302 (e.g., a-Si:H) formed between the transparent electrode 116 and the amorphous doped layer 114. The p+ doped interlayer 202 is comprised of a narrow bandgap material (e.g., p+ a-Ge:H) and is inserted between two p+ a-Si:H layers at the BSF contact 304 to improve carrier transport. This is due to the lower bandgap of a-Ge:H compared to a-Si:H, higher active doping of a-Ge:H compared to a-Si:H, or combination thereof. In some embodiments, the higher active doping of a-Ge:H is due to modulation doping of a-Ge:H or other materials. Modulation doping may include the addition of alternating layers of relatively wide bandgap (e.g., $p^+$ a-Si:H) and relatively narrow bandgap (e.g., $p^+$ a-Ge:H) materials. It should be understood that other materials may be employed for the interlayer 202, layers 114 and 302 or any other component.

Figure 3B:
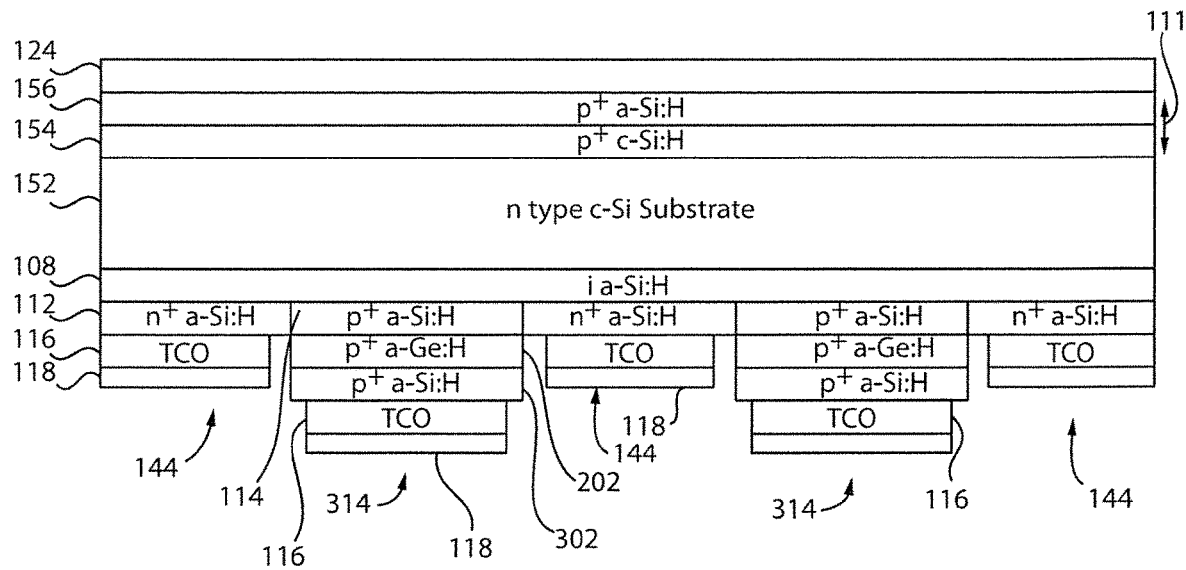
FIG. 3B is a cross-sectional view of the photovoltaic device of FIG. 2B having the interdigitated back contact including another p-doped layer formed on the interlayer in accordance with one embodiment.

Referring to FIG. 3B, another exemplary IBC HJ photovoltaic cell 350 is shown on an n-type c-Si substrate 152 according to another embodiment. In this embodiment, the structure of the cell 350 is the same as the structure of cell 250 of FIG. 2B, except that emitter contacts 314 include the interlayer 202 and another amorphous layer 302 (e.g., a-Si:H) formed between the transparent electrode 116 and the amorphous doped layer 114. The p+ doped interlayer 202 is comprised of a narrow bandgap material (e.g., p+ a-Ge:H) and is inserted between two p+ a-Si:H layers at the emitter contact 314 to improve carrier transport. This is due to the lower bandgap of a-Ge:H compared to a-Si:H, higher active doping of a-Ge:H compared to a-Si:H, or combination thereof. In some embodiments, the higher active doping of a-Ge:H is due to modulation doping of a-Ge:H. Modulation doping may include the addition of alternating layers of relatively wide bandgap (e.g., $p^+$ a-Si:H) and relatively narrow bandgap (e.g., $p^+$ a-Ge:H) materials. It should be understood that other materials may be employed for the interlayer 202, layers 114 and 302 or any other component.

Figure 4A:
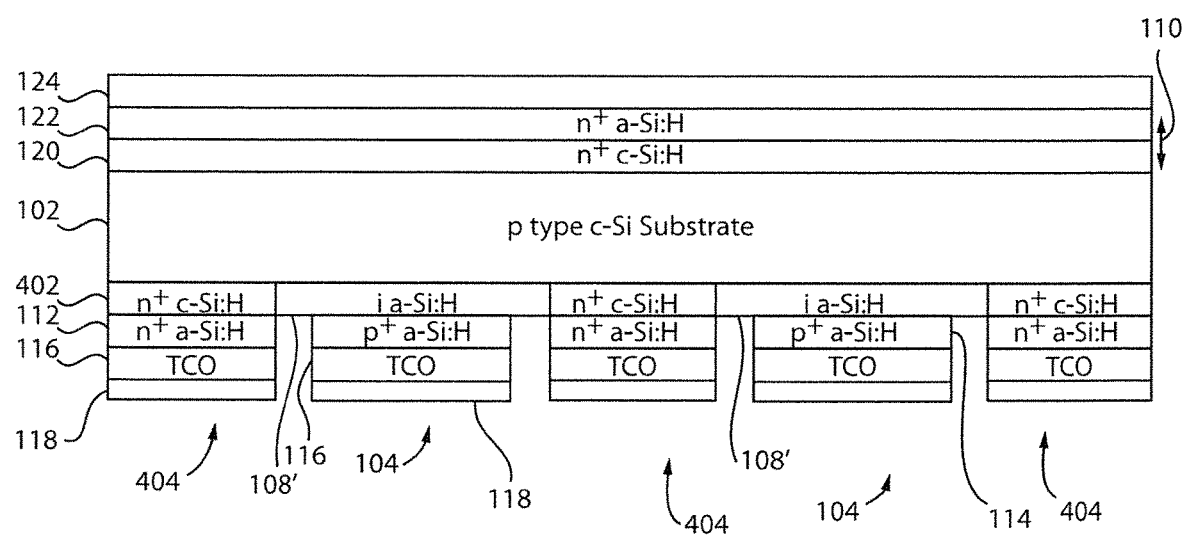
FIG. 4A is a cross-sectional view of the photovoltaic device of FIG. 1A having the interdigitated back contact including an n-doped crystalline layer in contact with the substrate in accordance with one embodiment.

Referring to FIG. 4A, another exemplary IBC HJ photovoltaic cell 400 is shown on a p-type c-Si substrate 102 according to another embodiment. In this embodiment, the structure of the cell 400 is the same as the structure of cell 100 of FIG. 1A, except that emitter contacts 404 include an n-type doped crystalline layer 402 instead of the intrinsic layer 108. The intrinsic layer 108 remains within the BSF contact 104 and is indicated as intrinsic layer 108'. In some embodiments, emitter contacts 404 may include n+ c-Si:H 402, n+ a-Si:H 112, TCO 116 and back surface 118. The emitter contacts 404 provide at least one or more of the following advantages as compared to emitter contacts 106 (FIG. 1A): (i) higher electric field at the junction, (ii) better surface passivation of c-Si:H (402), and (iii) lower contact resistance.

Figure 4B:
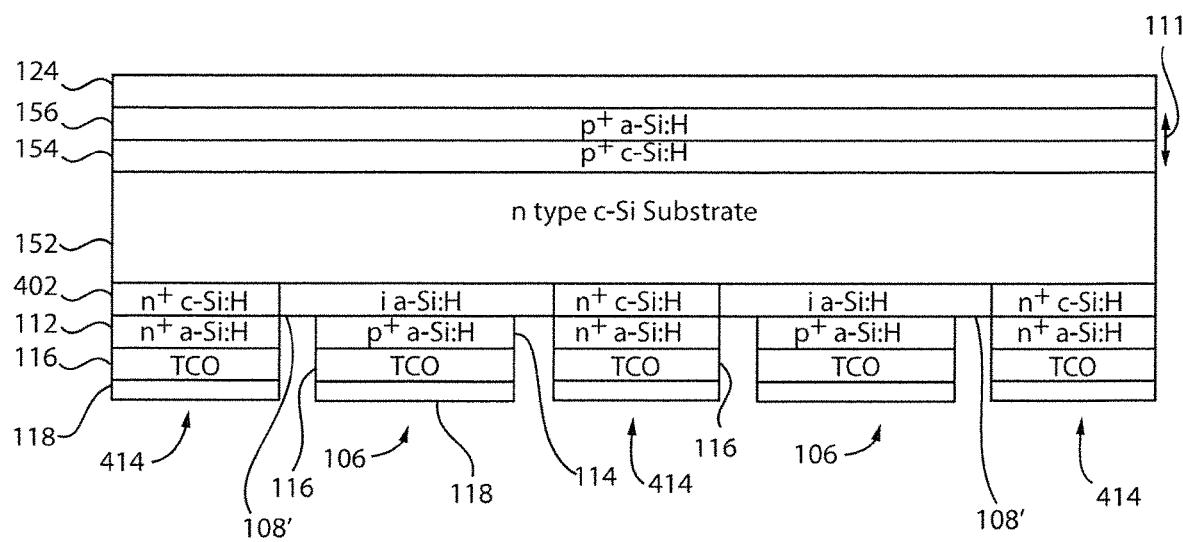
FIG. 4B is a cross-sectional view of the photovoltaic device of FIG. 1B having the interdigitated back contact including an n-doped crystalline layer in contact with the substrate in accordance with one embodiment.

Referring to FIG. 4B, another exemplary IBC HJ photovoltaic cell 450 is shown on an n-type c-Si substrate 152 according to another embodiment. In this embodiment, the structure of the cell 450 is the same as the structure of cell 150 of FIG. 1B, except that BSF contacts 414 include an n-type doped crystalline layer 402 instead of the intrinsic layer 108. The intrinsic layer 108 remains within the emitter contacts 106 and is indicated as intrinsic layer 108'. In some embodiments, BSF contacts 414 may include n+ c-Si:H 402, n+ a-Si:H 112, TCO 116 and back surface 118. The BSF contacts 414 provide at least one or more of the following advantages as compared to BSF contacts 104 (FIG. 1B): (i) higher electric field at the junction, (ii) better surface passivation of c-Si:H (402), and (iii) lower contact resistance.

Figure 5A:
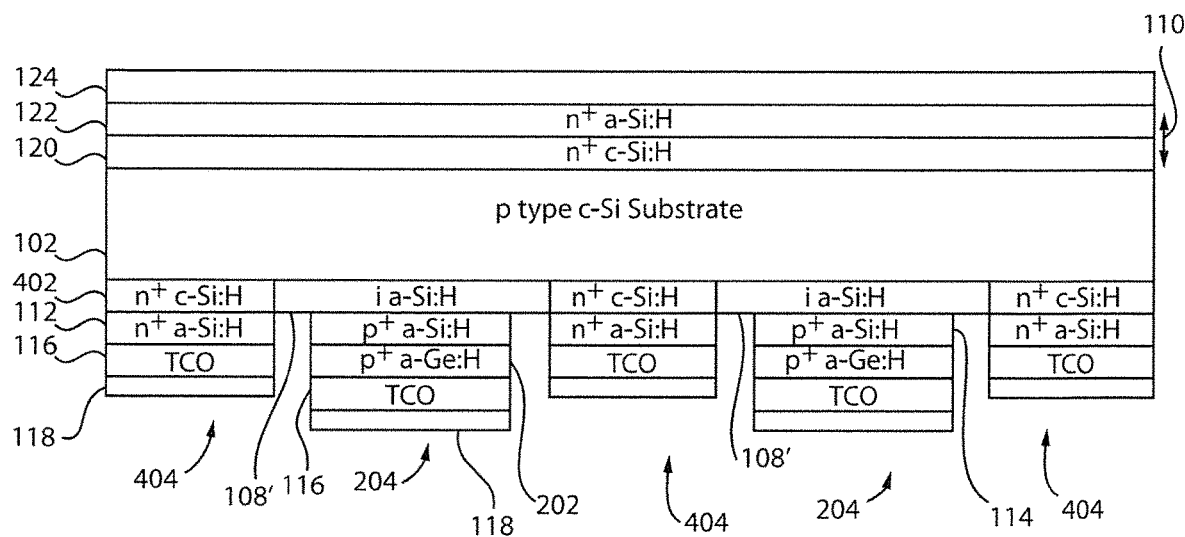
FIG. 5A is a cross-sectional view of a photovoltaic device having a front surface field contact with an n-doped crystalline layer and an n-doped noncrystalline layer, and an interdigitated back contact including an interlayer between a p-doped layer and a transparent electrode and an n-doped crystalline layer in contact with the substrate in accordance with one embodiment.

Referring to FIG. 5A, another exemplary IBC HJ photovoltaic cell 500 is shown on a p-type c-Si substrate 102 according to another embodiment. In this embodiment, the structure of the cell 500 includes a combination of emitter contacts 404 (shown in FIG. 4A) with BSF contacts 204 (shown in FIG. 2A). As before, the intrinsic layer 108 remains within the BSF contacts 204 and is indicated as intrinsic layer 108'.

Figure 5B:
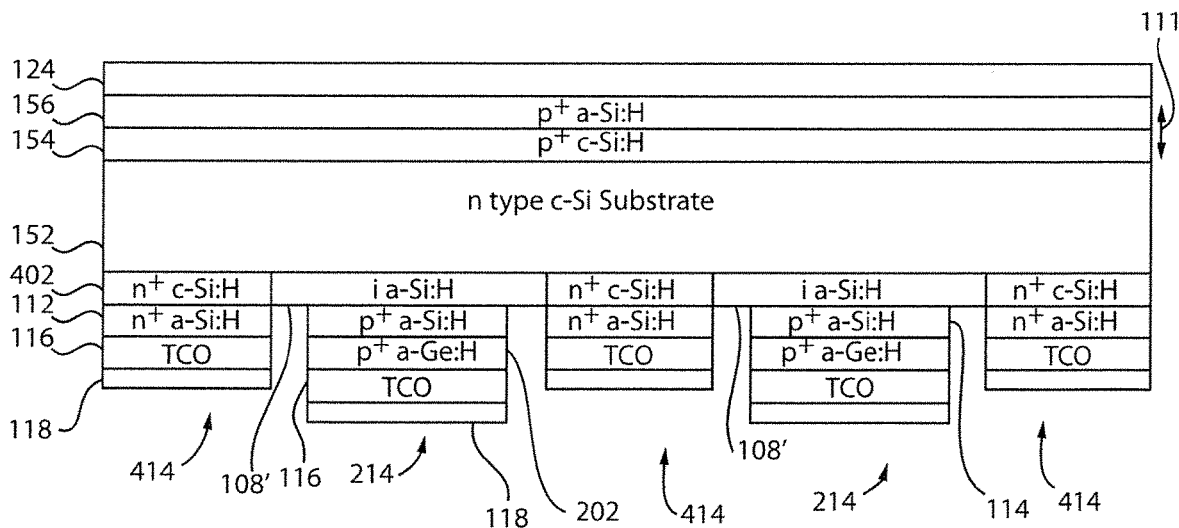
FIG. 5B is a cross-sectional view of a photovoltaic device having a front surface field contact with a p-doped crystalline layer and a p-doped noncrystalline layer, and an interdigitated back contact including an interlayer between a p-doped layer and a transparent electrode and an n-doped crystalline layer in contact with the substrate in accordance with one embodiment.

Referring to FIG. 5B, another exemplary IBC HJ photovoltaic cell 550 is shown on an n-type c-Si substrate 152 according to another embodiment. In this embodiment, the structure of the cell 550 includes a combination of emitter contacts 214 (shown in FIG. 2B) with BSF contacts 414 (shown in FIG. 4B). As before, the intrinsic layer 108 remains within the emitter contacts 214 and is indicated as intrinsic layer 108'.

Figure 6A:
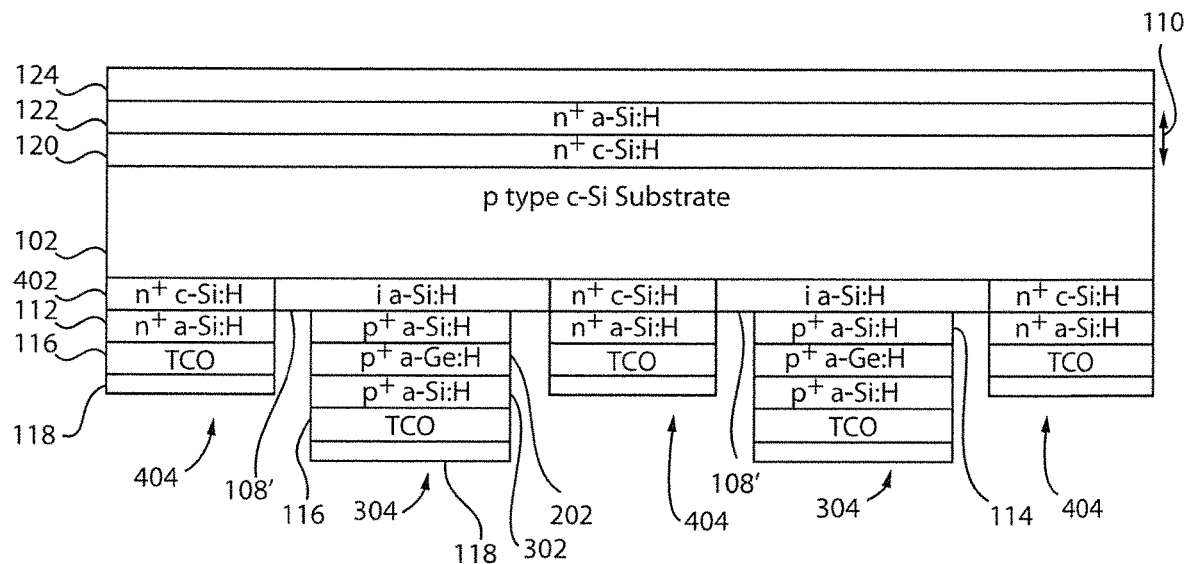
FIG. 6A is a cross-sectional view of a photovoltaic device having a front surface field contact with an n-doped crystalline layer and an n-doped noncrystalline layer, and an interdigitated back contact including a second p-doped layer formed on an interlayer between a first p-doped layer and a transparent electrode and an n-doped crystalline layer in contact with the substrate in accordance with one embodiment.

Referring to FIG. 6A, another exemplary IBC HJ photovoltaic cell 600 is shown on a p-type c-Si substrate 102 according to another embodiment. In this embodiment, the structure of the cell 600 includes a combination of emitter contacts 404 (shown in FIG. 4A) with BSF contacts 304 (shown in FIG. 3A). As before, the intrinsic layer 108 remains within the BSF contacts 304 and is indicated as intrinsic layer 108'.

Figure 6B:
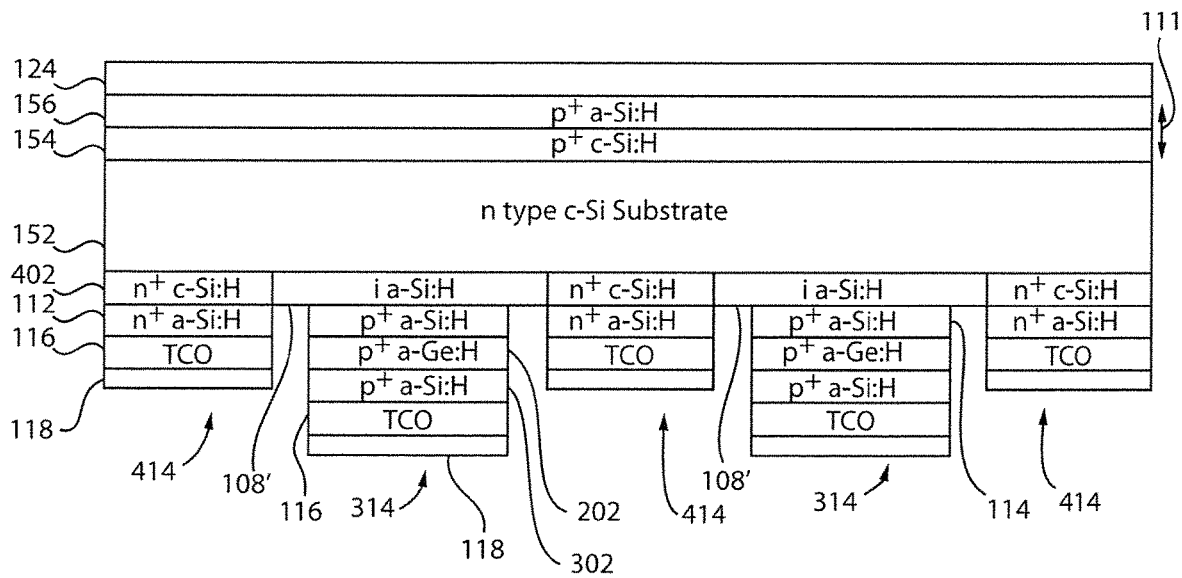
FIG. 6B is a cross-sectional view of a photovoltaic device having a front surface field contact with a p-doped crystalline layer and a p-doped noncrystalline layer, and an interdigitated back contact including a second p-doped layer formed on an interlayer between a first p-doped layer and a transparent electrode and an n-doped crystalline layer in contact with the substrate in accordance with one embodiment.

Referring to FIG. 6B, another exemplary IBC HJ photovoltaic cell 650 is shown on an n-type c-Si substrate 152 according to another embodiment. In this embodiment, the structure of the cell 650 includes a combination of BSF contacts 414 (shown in FIG. 4B) with emitter contacts 314 (shown in FIG. 3B). As before, the intrinsic layer 108 remains within the emitter contacts 314 and is indicated as intrinsic layer 108'. It should be noted the combinations of features depicted in FIGS. 5A, 5B, 6A and 6B, provide in combination all of the features and advantageous described for each emitter contact and/or BSF contact as provided individually. It should be further noted that other structures may be employed in addition to or instead of those illustratively described herein. For example, additional layers may be introduced between the layers depicted and different combinations of materials and layers may be employed.

In accordance with an aspect of the present principles, the substrate may include a dopant conductivity that is opposite that of the crystalline layer and the noncrystalline layer. With the substrate 102, 152 having an opposite dopant conductivity to that of the crystalline layer and the noncrystalline layer of the FSF junction, a floating junction is formed.

Figure 7A:
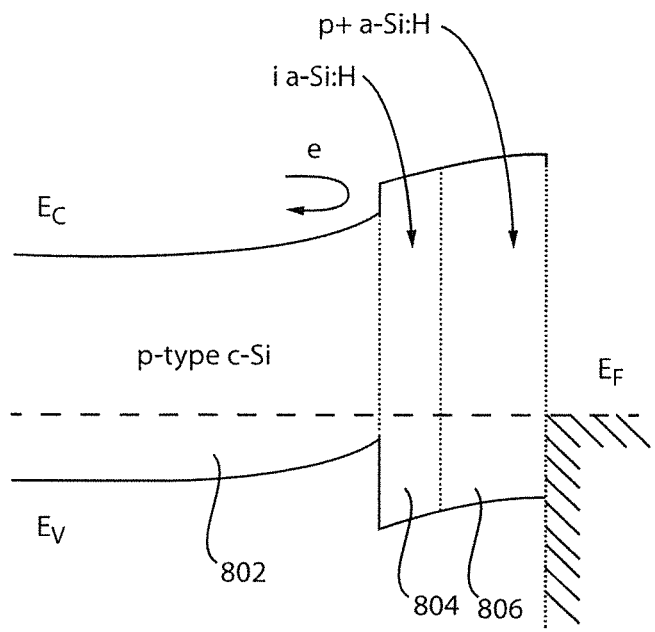
FIG. 7A is a band energy diagram showing band energies for a conventional structure having an intrinsic layer on a front surface field contact.

Referring to FIG. 7A, a band diagram shows a conventional device having a p-type monocrystalline substrate 802, an intrinsic (i) layer of amorphous hydrogenated Si (i a-Si:H) 804 and a p+ doped a-Si:H layer 806. This conventional structure for a front surface field (FSF) junction repels minority carriers (e). In addition, with an i a-Si:H layer 804, light absorption is high. Here, $E_c$, is the conduction band, $E_v$ is the valance band, and $E_F$ is the Fermi level.

Figure 7B:
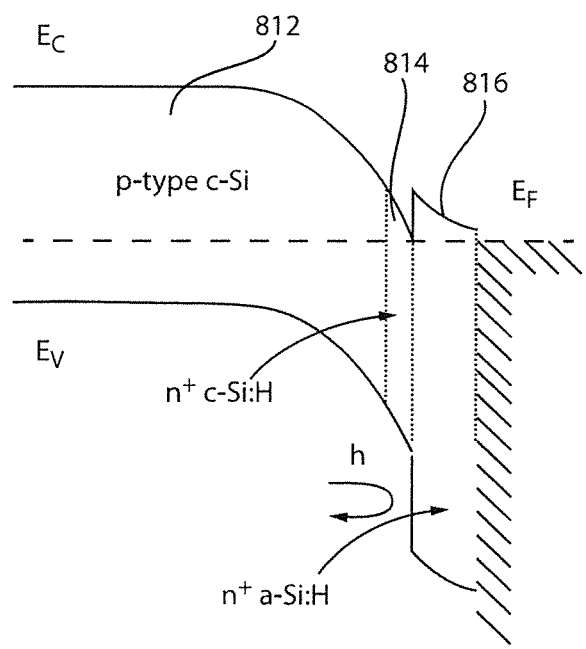
FIG. 7B is a band energy diagram showing band energies for a structure in accordance with the present principles having an n-doped crystalline layer and an n-doped noncrystalline layer on a p-doped substrate for a front surface field contact in accordance with the present principles.

Referring to FIG. 7B, a band diagram shows a device having a p-type monocrystalline substrate 812, an n-doped crystalline layer 814, e.g., a hydrogenated c-Si, and an n+ doped a-Si:H layer 816. This structure includes a front surface field (FSF) junction that repels majority carriers (h). The n+ c-Si:H (814)/n+ a-Si:H (816) stack forms a floating p-n junction at the front surface, shielding the front surface from the majority carriers (holes) and therefore reducing carrier recombination at the front surface. In addition, with the i a-Si:H layer 804 replaced by layer 814, light absorption is reduced. One advantage for this embodiment includes that by repelling the majority carriers (h) (as opposed to repelling minority carriers (e) in the conventional FSF stack of FIG. 7A), the carrier trapping rate and therefore recombination rate at the surface of the c-Si substrate can be reduced. This is because the capture cross section is larger for electrons than holes. Further, n+ a-Si:H is usually more transparent than p+ a-Si:H, resulting in a lower absorption loss. Also, n+ a-Si:H can be grown with a lower defect density and therefore with a higher doping efficiency and activated doping density than p+ a-Si:H. Although p+ layers are also contemplated for use.

Figure 8:
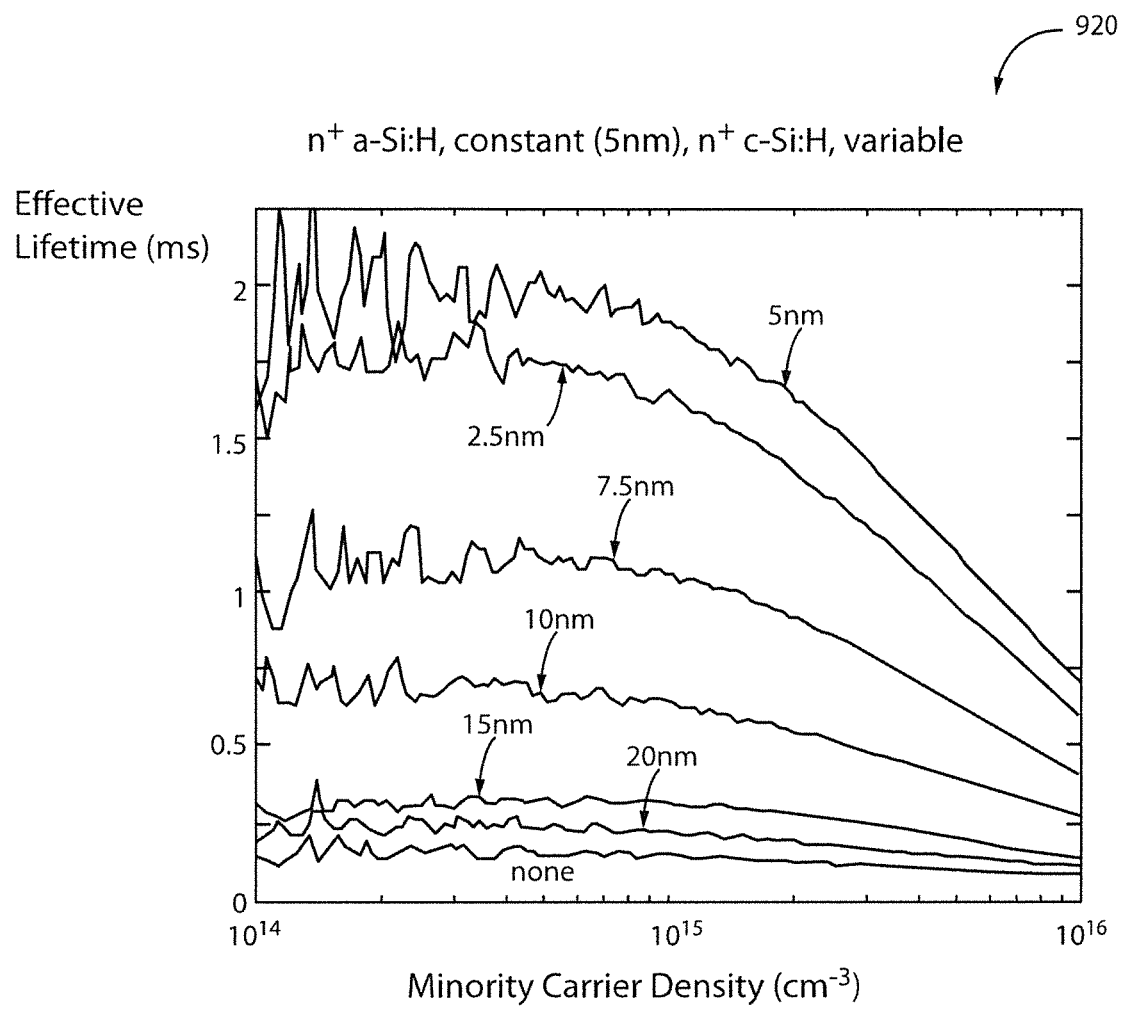
FIG. 8 shows a graph and a test structure showing a relationship between thicknesses of an n-doped crystalline layer and an n-doped noncrystalline layer on a p-doped substrate for a front surface field contact in accordance with the present principles.
Figure 8:
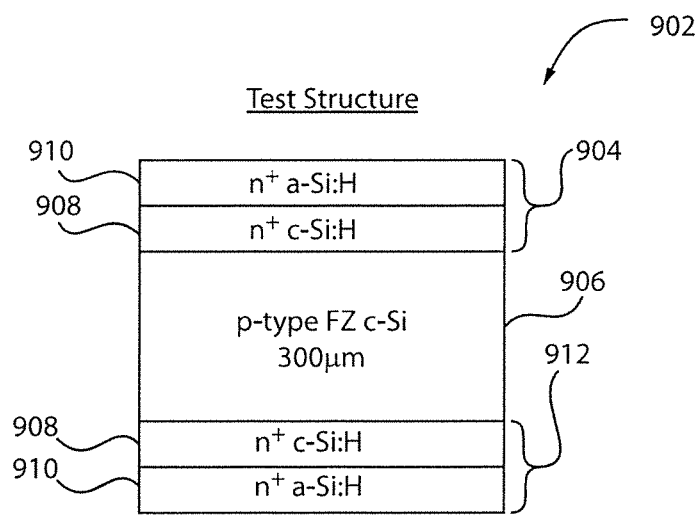

Referring to FIG. 8, experimental results are depicted for determining an optimum combination of crystalline layer/ noncrystalline layer thicknesses for an FSF junction/contact in accordance with the present principles, using photoconductance decay (PCD) measurements. A test structure 902 is shown having an FSF contact 904. The FSF contact 904 was formed on a p-type FZ c-Si substrate 906 having a 300 micron thickness. The FSF contact 904 includes a crystalline layer 908 and a noncrystalline layer 910. Layers 908 and 910 where n-type doped. The crystalline layer 908 included n+ c-Si:H, and the noncrystalline layer 910 included n+ a-Si:H. A bottom contact 912 included the same layers 908 and 910, as the top contact 904 to farm a symmetrically passivated structure for the PCD measurements.

Different combinations of thicknesses for crystalline layer 908/noncrystalline layer 910 where formed and tested. The results are shown in a graph 920, which plots effective minority carrier lifetime (ms) versus minority carrier density $(cm^{-3})$. The following thicknesses were used for the crystalline layer 908 while maintaining the noncrystalline layer 910 constant at 5 nm: no crystalline layer (none), 2.5 nm, 5 nm, 7.5 nm, 10 nm, 15 nm and 20 nm, all with an activated doping level of $5\times10^{19} cm^{-3}$. Of these, the thickness 5 nm achieved the longest minority carrier lifetime. As before, to achieve the best results, there needs to be a balance between thinner layers (dominated by insufficient interfacial hydrogen) and thicker layers (dominated by excessive Auger recombination in n+ c-Si:H).

The FSF contact 904 showed excellent passivation and lower absorption loss. The lower absorption loss is provided due to the elimination of an intrinsic layer on the FSF contact. In addition, with lower absorption loss, greater short circuit current and therefore cell efficiency is provided. Since the n+ c-Si:H/c-Si junction is the main determinant of the electric field accounting for field-induced passivation at the surface of the c-Si substrate, the effect of, the work function of the ARC layer 124 (FIG. 1A) on the field-induced passivation is less of a concern. This provides greater flexibility in selecting a material for the ARC layer 124. The portion of the passivation accounted for by the presence of an electric field at the junction is referred to as "field-induced" passivation, as opposed to "chemical" passivation which refers to the saturation of the dangling at the substrate surface, e.g. by H atoms.

It should also be noted that, in some alternative implementations, the functions noted in the blocks of the following block diagrams may occur out of the order noted in the FIGS. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 9:
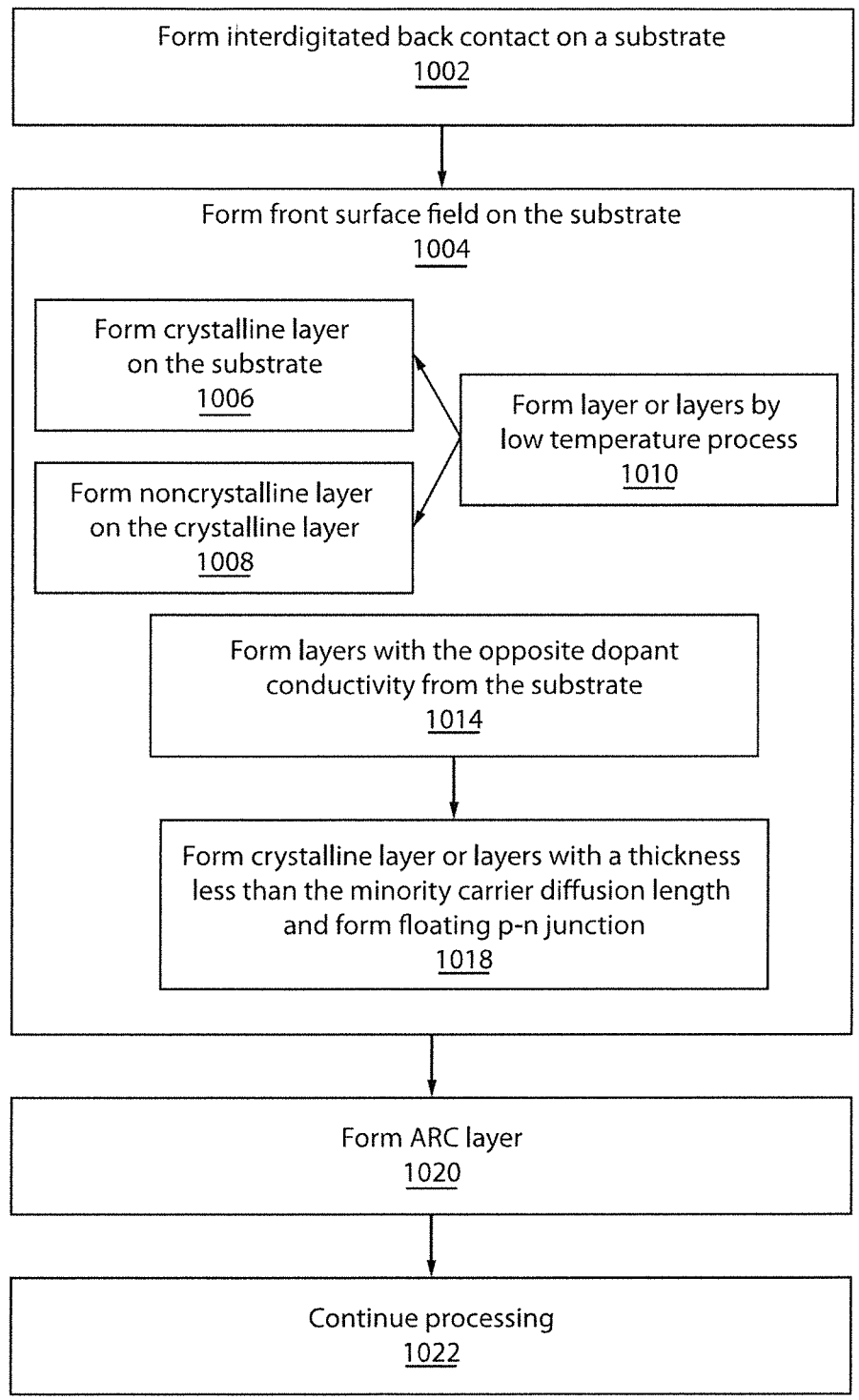
FIG. 9 is a block/flow diagram showing a method for making photovoltaic devices in accordance with illustrative embodiments.

Referring to FIG. 9, a method for forming a photovoltaic stack is illustratively shown in accordance with exemplary embodiments. In block 1002, an interdigitated back contact is formed on a crystalline substrate having a first dopant conductivity. The interdigitated structure may include any of the structures described above or any other useful structure. In block 1004, a front surface field structure is formed on the substrate. In block 1006, the front surface field includes a crystalline layer formed on the substrate. In block 1008, an amorphous layer is formed on the crystalline layer.

In block 1010, the crystalline layer is formed by epitaxially growing the crystalline layer on the substrate using a PECVD or HWCVD process at temperatures below 450 degrees Celsius, as described above. The crystalline layer and the noncrystalline layer may both be formed using this process; however, the process conditions for growing crystalline and non-crystalline layers differ from each other. In addition, the crystalline layer and the noncrystalline layer may be doped in-situ.

In one embodiment, in block 1014, the crystalline layer and the noncrystalline layer are doped with dopants having an opposite dopant conductivity than the substrate. In block 1018, the crystalline layer forms a floating p-n junction that repels majority carriers from a front surface. The crystalline layer includes a thickness less than a diffusion length of minority carriers in the crystalline layer. An ARC layer or the like may be formed of the front surface field in block 1020. Processing continues with the formation of other structures and the completion of the device in block 1022.

Having described preferred embodiments for an interdigitated back contact heterojunction photovoltaic device with a floating junction front surface field (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.Having thus described aspects of the invention, with the details and particularity required by the patent laws, what is claimed and desired protected by Letters Patent is set forth in the appended claims.

What is claimed is:

1. A method for forming a photovoltaic device, comprising:
   forming an interdigitated back contact, including a continuous layer on a crystalline substrate having a first dopant conductivity, the continuous layer including alternating crystalline regions and noncrystalline regions, wherein forming the interdigitated back contact includes forming back surface field stacks on the noncrystalline region and forming emitter stacks; and
   forming a front surface field structure on the substrate by:
      forming a crystalline layer on the substrate; and
      forming a noncrystalline layer directly on the crystalline layer, wherein the crystalline layer includes a thickness less than a diffusion length of minority carriers in the crystalline layer, the crystalline layer and the noncrystalline layer being doped with dopants having an opposite dopant conductivity than the substrate.

2. The method as recited in claim 1, wherein the noncrystalline region includes at least a first area with a different thickness than a second area.

3. The method as recited in claim 1, wherein forming the crystalline layer on the substrate includes epitaxially growing the crystalline layer on the substrate using a plasma enhanced chemical vapor deposition process at temperatures below 450 degrees Celsius.

4. The method as recited in claim 1, wherein the crystalline substrate includes silicon, and the crystalline layer and the noncrystalline layer include hydrogenated silicon having 5-40 atomic percent hydrogen.

5. The method as recited in claim 1, wherein the crystalline layer includes an active doping level higher than an active doping density of the substrate.

6. The method as recited in claim 1, wherein the back surface field stacks and emitter stacks each comprise a transparent conductive oxide.

7. The method as recited in claim 1, wherein forming the back surface field stacks and emitter stacks includes forming the back surface field stacks and emitter stacks in an alternating pattern, wherein one of the back surface field stacks and the emitter stacks includes:
   an n-doped noncrystalline layer formed on the crystalline region in contact with the substrate, and a first transparent electrode formed on the n-doped noncrystalline layer;

and the other of the back surface field stacks and the emitter stacks includes:
   a p-doped noncrystalline layer formed on the noncrystalline region, and a second transparent electrode spaced apart from the first transparent electrode and formed on the p-doped noncrystalline layer.

8. The method as recited in claim 1, wherein forming the front surface field structure includes forming a floating p-n junction at an interface between the crystalline layer and the substrate, the p-n junction being configured to repel majority carriers from a front surface.

9. The method as recited in claim 1, wherein the crystalline regions are comprised of the same hydrogenated silicon material as the noncrystalline regions.

10. The method as recited in claim 6, wherein the emitter stacks are formed on the crystalline region.

* * * * *